(12) United States Patent
Niimi et al.

(10) Patent No.: US 7,799,649 B2
(45) Date of Patent: *Sep. 21, 2010

(54) METHOD FOR FORMING MULTI GATE DEVICES USING A SILICON OXIDE MASKING LAYER

(75) Inventors: Hiroaki Niimi, Dallas, TX (US); Reima Tapani Laaksonen, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 41 days.

This patent is subject to a terminal disclaimer.

(21) Appl. No.: 11/279,602

(22) Filed: Apr. 13, 2006

(65) Prior Publication Data

US 2007/0243683 A1    Oct. 18, 2007

(51) Int. Cl.
*H01L 21/336* (2006.01)

(52) U.S. Cl. .................. 438/287; 438/770; 438/775; 438/981; 257/E21.302

(58) Field of Classification Search .............. 438/287, 438/981, 770–784; 257/E21.302
See application file for complete search history.

(56) References Cited

U.S. PATENT DOCUMENTS

| 2002/0185693 A1* | 12/2002 | Yasuda et al. ............... 257/392 |
| 2003/0228725 A1* | 12/2003 | Tsujikawa et al. .......... 438/197 |
| 2004/0043638 A1* | 3/2004 | Nansei et al. ............... 438/792 |
| 2006/0138550 A1* | 6/2006 | Cho et al. .................... 257/369 |

* cited by examiner

*Primary Examiner*—H. Jey Tsai
(74) *Attorney, Agent, or Firm*—Warren L. Franz; Wade J. Brady, III; Frederick J. Telecky, Jr.

(57) ABSTRACT

The present invention provides a method for manufacturing a semiconductor device. The method, in one embodiment, includes forming a silicon oxide masking layer over a substrate in a first active region and a second active region of a semiconductor device, patterning the silicon oxide masking layer to expose the substrate in the first active region. The method further includes forming a layer of dielectric material over the substrate in the first active region, the patterned silicon oxide masking layer protecting the substrate from the layer of dielectric material in the second active region.

20 Claims, 5 Drawing Sheets

METHOD FOR FORMING MULTI GATE DEVICES USING A SILICON OXIDE MASKING LAYER

TECHNICAL FIELD OF THE INVENTION

The present invention is directed, in general, to a method for manufacturing a semiconductor device and, more specifically, to a method for manufacturing a semiconductor device using a silicon oxide masking layer.

BACKGROUND OF THE INVENTION

In certain semiconductor applications it has become necessary to integrate multi gate oxide (MGO) thicknesses for associated transistor devices onto a single integrated circuit device. One motivation for performing multi gate oxide processing is that high performance transistors typically operate at lower voltages (e.g., 0.8 volts to 1.5 volts), and thus require thinner gate dielectric regions, whereas devices that interface with most conventional external peripherals typically require higher operating voltages (e.g., 1.8 volts to 3.5 volts), and thus require thicker gate dielectric regions. When interfacing lower voltage high performance metal-oxide-semiconductor field-effect-transistors (MOSFETs) within a core of an integrated circuit, to higher voltage peripheral devices, input and output (I/O) buffers of the integrated circuit (IC) are typically designed to contain thicker gate dielectric regions that are compatible with the higher external peripheral device voltages.

For example, current microcontroller units (MCUs) and digital signal processors (DSPs) are integrating multiple different types of technology onto a single integrated circuit, such as high speed logic, power logic, static random access memory (SRAM), nonvolatile memory (NVM), embedded dynamic random access memory (DRAM), analog circuitry, and other devices and technologies. Many of these devices require different gate dielectric processing and different gate dielectric thicknesses to provide both high performance lower voltage devices within the core of the device and higher voltage I/O devices to interface with external peripheral devices.

As stated above, a multi gate thickness structure includes thin gate dielectrics for high performance low voltage operation core devices, and thick gate dielectrics for low leakage high voltage operation I/O devices. As devices shrink, even the thick gate dielectrics are getting thinner to meet device requirements. This can cause increased leakage current for the devices, especially the high voltage devices having the thick gate dielectrics.

It has generally been accepted that the leakage current can be mitigated by introducing nitrogen atoms into the gate dielectrics to suppress leakage currents for both the thin and thick gates. One method of nitrogen atom introduction includes performing non-thermal nitridation (e.g., plasma nitridation) on the gate dielectrics. Unfortunately, this and other methods of introducing the nitrogen atoms into the gate dielectrics tend to provide a non-uniform nitrogen profile in the gate dielectric, which results in reduced reliability. The non-uniformity, and thus reduced reliability, is particularly significant in thicker gate dielectrics, such as those used in the aforementioned high voltage devices.

Accordingly, what is needed in the art is an improved method for manufacturing multi gate thickness structures.

SUMMARY OF THE INVENTION

The present invention provides a method for manufacturing a semiconductor device. The method, in one embodiment, includes forming a silicon oxide masking layer over a substrate in a first active region and a second active region of a semiconductor device, patterning the silicon oxide masking layer to expose the substrate in the first active region. The method further includes forming a layer of dielectric material over the substrate in the first active region, the patterned silicon oxide masking layer protecting the substrate from the layer of dielectric material in the second active region.

The present invention provides, in an alternative embodiment, a method for manufacturing an integrated circuit. The method for manufacturing the integrated circuit includes forming gate structures in or over a first active region and a second active region of a semiconductor device, and forming interconnects within dielectric layers located over the gate structures. In one embodiment, forming the gate structures includes (1) forming a silicon oxide masking layer over a substrate in the first active region and the second active region, (2) patterning the silicon oxide masking layer to expose the substrate in the first active region, (3) forming a layer of dielectric material over the substrate in the first active region, the patterned silicon oxide masking layer protecting the substrate from the layer of dielectric material in the second active region, and (4) forming a layer of gate electrode material over the first and second active regions after forming the layer of dielectric material.

The present invention further provides a semiconductor device. The semiconductor device, without limitation, includes a semiconductor substrate, a gate dielectric layer located over the semiconductor substrate and formed at least partially using a silicon oxide masking layer, and a gate electrode layer located over the gate dielectric layer, the gate dielectric layer and the gate electrode layer forming at least a portion of a gate structure.

BRIEF DESCRIPTION OF THE DRAWINGS

For a more complete understanding of the present invention, reference is now made to the following descriptions taken in conjunction with the accompanying drawings, in which.

DETAILED DESCRIPTION

Turning now to FIGS. 1-9, illustrated are sectional views illustrating how one might, in an advantageous embodiment, manufacture a semiconductor device in accordance with the principles of the present invention. While FIGS. 1-9 are specifically directed to the manufacture of a semiconductor device having dual gate dielectric thickness layers, the ideas therein could easily be applied to other semiconductor devices, including semiconductor devices having triple gate dielectric thickness layers, among others.

Figure 1:
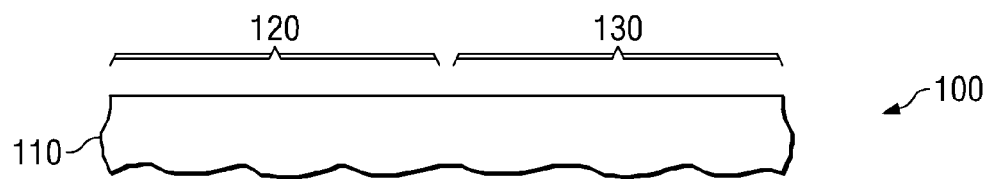
FIGS. 1-9 illustrate sectional views showing how one might, in one embodiment, manufacture a semiconductor device in accordance with the principles of the present invention.

FIG. 1 illustrates a sectional view of a partially completed semiconductor device 100 manufactured in accordance with the principles of the present invention. The semiconductor device 100 of FIG. 1 includes a semiconductor substrate 110. The semiconductor substrate 110 may, in an embodiment, be any layer located in the semiconductor device 100, including a wafer itself or a layer located above the wafer (e.g., epitaxial layer). In the embodiment illustrated in FIG. 1, the semiconductor substrate 110 is a P-type substrate; however, one skilled in the art understands that the semiconductor substrate 110 could be an N-type substrate without departing from the scope of the present invention.

The embodiment of the semiconductor device 100 illustrated in FIG. 1 includes two different regions, including a left active region 120 and a right active region 130. As will be understood more fully in subsequent paragraphs, the left active region 120 is a higher voltage active region and the right active region 130 is a lower voltage active region. For instance, the left active region 120 might be an input/output active region and the right active region 130 might be a core region designed for a specific performance and voltage requirement. Other configurations might also exist, for instance one wherein the semiconductor device 100 includes three or more different regions, such as was discussed in the paragraphs above.

Figure 2:
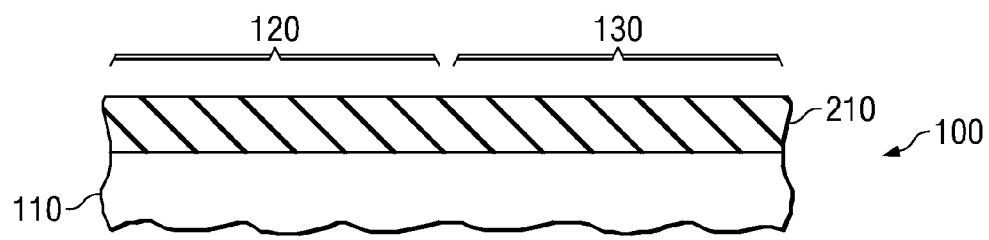

Turning now briefly to FIG. 2, illustrated is the semiconductor device 100 illustrated in FIG. 1 after forming a silicon oxide masking layer 210 over one or more of the left or right active regions 120, 130. In the embodiment shown, the silicon oxide masking layer 210 is formed over, and in this embodiment on, both of the left and right active regions 120, 130. The silicon oxide masking layer 210 may comprise many different materials and may be formed using many different processes and remain within the purview of the present invention. Nevertheless, the silicon oxide masking layer 210 in the embodiment of FIG. 2 comprises a silicon dioxide masking layer. For instance, the silicon dioxide masking layer could be a thermal or plasma oxidation of the semiconductor substrate 110, or alternatively a thermal or plasma oxide formed via chemical vapor deposition (CVD) or physical vapor deposition (PVD). Generally, the silicon oxide masking layer 210 would have a thickness ranging from about 5 nm to about 10 nm, among others. It is believed that such a thickness for the silicon oxide masking layer 210 provides that the layer of nitrogen atoms 520 (FIG. 5, below) will generally be formed on only the top surface of the oxide masking layer 210 during the following plasma nitridation process. Accordingly, there is generally no interfacial nitridation. Since the layer of nitrogen atoms 520 (FIG. 5, below) is only on the top surface of the oxide masking layer 210, it easy to remove/replace nitrogen layer via radical oxidation. Moreover, since no nitrogen exists at the interface between the substrate 110 and the oxide masking layer 210, it is easy to deglaze the oxide masking layer 210 using conventional wet chemicals (FIG. 6, below). All that being said, those skilled in the art understand the processing steps that might be taken to form such a silicon oxide masking layer 210, thus no further detail is warranted.

Figure 3:
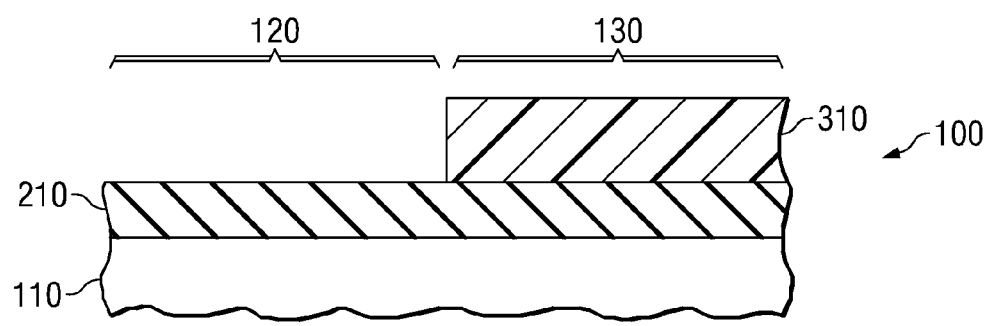

Turning now to FIG. 3, illustrated is the semiconductor device 100 of FIG. 2 after forming a photoresist portion 310 over the silicon oxide masking layer 210. In the given embodiment of FIG. 3, the photoresist portion 310 may be conventionally spun on, exposed and developed, resulting in the photoresist portion 310 remaining in the right active region 130. In other embodiments of the present invention, such as those wherein three or more active regions exist, the photoresist portion 310 might remain in other active regions. Those skilled in the art understand the processing steps that might be taken to form and pattern the photoresist portion 310, thus again no further detail is warranted.

Figure 4:
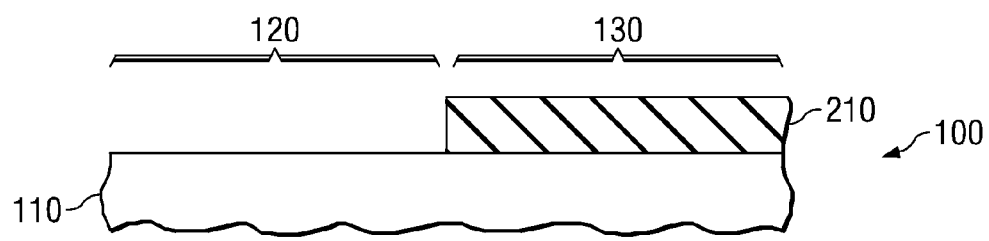

Turning now to FIG. 4, illustrated is the semiconductor device 100 of FIG. 3 after patterning the silicon oxide masking layer 210 using the photoresist portion 310 and an etchant. In the embodiment of FIG. 4, the silicon oxide masking layer 210 is patterned to expose the semiconductor substrate 110 in the left active region 120 and protect the semiconductor substrate 110 in the right active region 130. Those skilled in the art understand the process for patterning the silicon oxide masking layer 210, including subjected the exposed portions of the silicon oxide masking layer 210 to a hydrofluoric acid etch, among others. The etch used to remove the silicon oxide masking layer 210 should, however, be designed to be selective to the silicon oxide masking layer 210 and not other material layers, particularly other nitride material layers.

Figure 5:
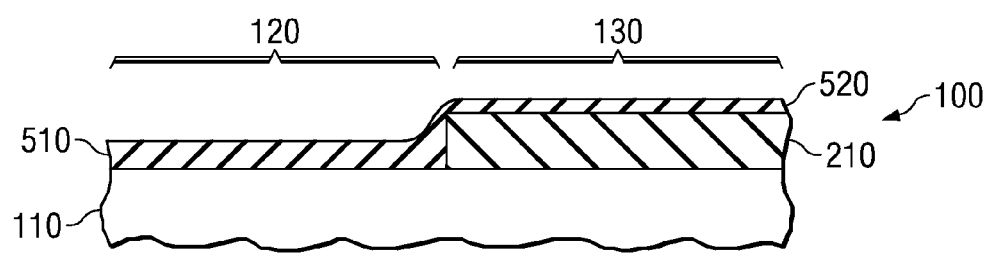
Figure 6:
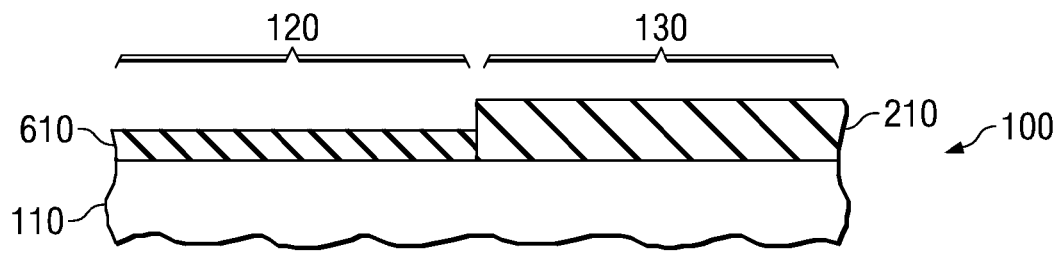

Turning now to FIG. 5, illustrated is the semiconductor device 100 of FIG. 4 after subjecting exposed portions of the semiconductor substrate 110 to a nitrogen containing plasma. In one embodiment of the present invention, the semiconductor substrate 110 is subjected to an initial pre-clean process (e.g., a standard wet chemical clean-up process), and then subjected to the nitrogen containing plasma. However, the initial pre-clean process is optional. As is illustrated in the embodiment of FIG. 5, the nitrogen containing plasma forms a first layer of gate dielectric material 510 over the substrate 110 in the left region 120. In this embodiment, the nitrogen containing plasma additionally forms a layer of nitrogen atoms 520 in or on an upper surface of the silicon oxide masking layer 210 in the right active region 130. The first layer of gate dielectric material 510 located over the left active region 120, at this stage of manufacture, would typically comprise $Si_xN_y$, and might have a thickness ranging from about 1 nm to about 3 nm, among others. A thickness of the layer of nitrogen atoms 520 formed in or on the silicon oxide masking layer 210 would typically be less than the thickness of the first layer of gate dielectric material 510 formed over the semiconductor substrate 110. For instance, the thickness of the layer of nitrogen atoms 520 formed in or on the silicon oxide masking layer 210 would typically range from about 0.4 nm to about 0.8 nm.

The first layer of gate dielectric material 510 and the layer of nitrogen atoms 520 may be formed using various different processes. For example, the first layer of gate dielectric material 510 and layer of nitrogen atoms 520 may be formed by subjecting the substrate 110 in the left active region 120, as well as the silicon oxide masking layer 210 in the right active region 130, respectively, to a radical nitridation process. The radical nitridation process, among others, might use a temperature ranging from about 400° C. to about 800° C., a pressure ranging from about 700 mTorr to about 900 mTorr, a microwave power ranging from about 500 Watts to about 2000 Watts, in the presence of a flow of nitrogen ranging from about 50 sccm to about 100 sccm, and a flow of argon ranging from about 950 sccm to about 1000 sccm, for a time period ranging from about 10 seconds to about 30 seconds. In an alternative embodiment, the radical nitridation process might use a temperature ranging from about room temperature to about 300° C., a pressure ranging from about 10 mTorr to about 50 mTorr, an effective pulse RF power ranging from about 300 Watts to about 700 Watts, in the presence of a flow of nitrogen ranging from about 100 sccm to about 500 sccm, for a time period ranging from about 10 seconds to about 30 seconds. These processing conditions should not be used to limit the scope of the present invention.

Turning now to FIG. 6, illustrated is the semiconductor device 100 of FIG. 5 after incorporating oxygen into the first layer of gate dielectric material 510 to form a first layer of gate dielectric material 610 having oxygen therein. The first layer of gate dielectric material 610, in this embodiment, is located over the semiconductor substrate 110 in the left active region 120, and comprises $Si_xN_yO_z$. For example, the $Si_xN_yO_z$ might have a surplus of nitrogen as compared to oxygen, thus y>z>0.

The oxygen may be incorporated using one of any number of different processes. For instance, the first layer of gate dielectric material 610 may be subjected to a radical oxidation process to form the gate dielectric material comprising $Si_xN_yO_z$. The radical oxidation process, among other conditions, might use a temperature ranging from about 200° C. to about 400° C., a pressure ranging from about 30 mTorr to about 150 mTorr, a microwave power ranging from about 500 Watts to about 1500 Watts, in the presence of a flow of oxygen ranging from about 5 sccm to about 50 sccm, and a flow of argon ranging from about 850 sccm to about 1250 sccm, for a time period ranging from about 5 seconds to about 20 seconds. Other conditions outside of the aforementioned ranges could also be used. Similarly, the first layer of gate dielectric material 610 having oxygen therein might be formed using a completely different process.

As is illustrated in FIG. 6, the incorporation of oxygen into the first layer of gate dielectric material 510, particularly when doing so using a radical oxidation process, substantially, if not completely, replaces the nitrogen atoms in the layer of nitrogen atoms 520 with oxygen atoms, all the while incorporating the oxygen into the first layer of gate dielectric material 510. Substantially, as used in this context, means that all but trace amounts of the nitrogen atoms are replaced with the oxygen atoms. This radical oxidation process may, at the same time, replace a small portion of the nitrogen atoms located in the upper surface of the first layer of gate dielectric material 610 with oxygen atoms.

In an optional step of the present invention, the first layer of gate dielectric material 610 may be subjected to a reoxidation step after incorporating the oxygen therein. For example, the first layer of gate dielectric material 610 may be subjected to a reoxidation step using an anneal temperature ranging from about 900° C. to about 1100° C., a pressure ranging from about 10 Torr to about 50 Torr, an $O_2$, $N_2O$, NO or any mixture thereof flow rate ranging from about 10 slm to about 20 slm, for a time period ranging from about 2 seconds to about 20 seconds.

Figure 7:
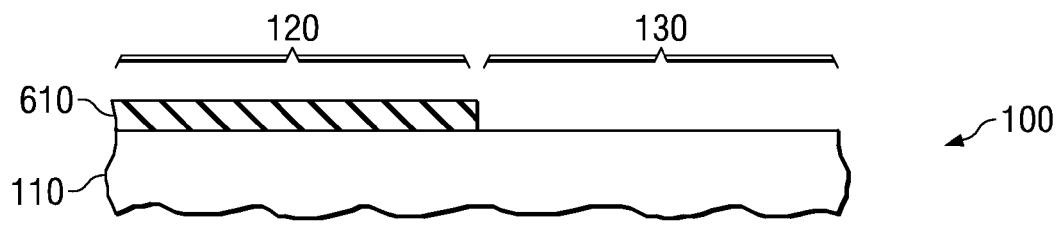

Turning now briefly to FIG. 7, illustrated is the semiconductor device 100 illustrated in FIG. 6 after removing the silicon oxide masking layer 210. Those skilled in the art understand the processes that might be used to remove the silicon oxide masking layer 210, including using a selective etch for its removal. In one embodiment, a 5% hydrofluoric acid etch is used to remove the silicon oxide masking layer 210, this etch removing approximately 30 nm/min of the masking layers while only removing about 0.8 nm/min of the gate dielectric material. In an alternative embodiment, a 0.5% hydrofluoric acid etch is used to remove the silicon oxide masking layer 210, this etch removing approximately 7 nm/min of the masking layers while removing very little, if any, of the gate dielectric material.

Figure 8:
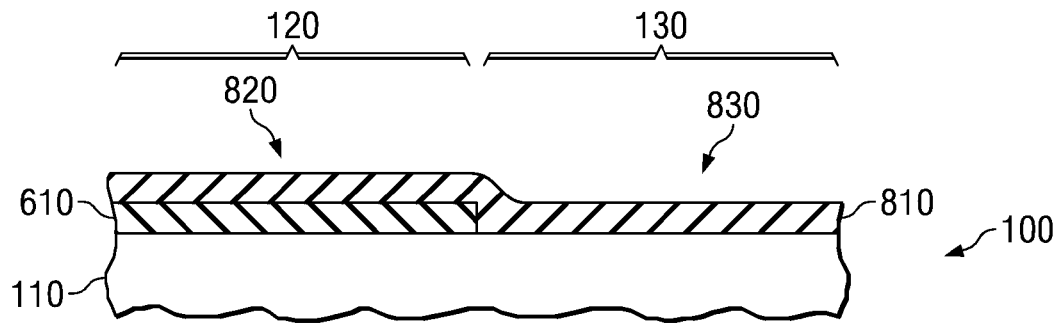

Turning now to FIG. 8, illustrated is the semiconductor device 100 of FIG. 7 after forming a second layer of gate dielectric material 810 over the semiconductor substrate 110. As is illustrated, the second layer of gate dielectric material 810 is located over the first layer of gate dielectric material 610 in the left active region 120 and the semiconductor substrate 110 in the right active region 130. For instance, the second layer of gate dielectric material 810 might be formed as a layer (e.g., blanket formed) over each of the left and right active device regions 120, 130.

The second layer of gate dielectric material 810 may comprise a number of different materials and remain within the scope of the present invention. However, one embodiment of the present invention has the second layer of gate dielectric material 810 comprise $Si_xN_yO_z$. For example, the second layer of gate dielectric material 810 might comprise $Si_xN_yO_z$, wherein y>z>0. Thus, in this embodiment the second layer of gate dielectric material 810 is a nitrogen rich silicon oxynitride layer. In other embodiments, the second layer of gate dielectric material 810 might comprise another type of nitrided gate dielectric material. The second layer of gate dielectric material 810, in accordance with the principles of the present invention, would generally have a thickness ranging from about 1 nm to about 3 nm. Other thicknesses could nonetheless also be used and remain within the purview of the present invention.

The second layer of gate dielectric material 810 may be formed using various different processes. However, in one embodiment the second layer of gate dielectric material 810 is formed by first subjecting the first layer of gate dielectric material 610 in the left active region 120 and the semiconductor substrate 110 in the right active region 130 to a nitrogen containing plasma, thereby forming a layer comprising $Si_xN_y$. This process might be substantially similar to that discussed above with respect to FIG. 5, for instance using a radical nitridation process. After forming the layer comprising $Si_xN_y$, the layer comprising $Si_xN_y$ may have oxygen incorporated therein to form the second layer of gate dielectric material 810, in this embodiment comprising $Si_xN_yO_z$. This process might be substantially similar to that discussed above with respect to FIG. 6, for instance using a radical oxidation process.

In an optional step of the present invention, the second layer of gate dielectric material 810 may again be subjected to a reoxidation step after incorporating the oxygen therein. What results, at least in this embodiment, is a first greater thickness gate dielectric 820 in the left active region 120 and a second lesser thickness gate dielectric 830 in the right active region 130.

Figure 9:
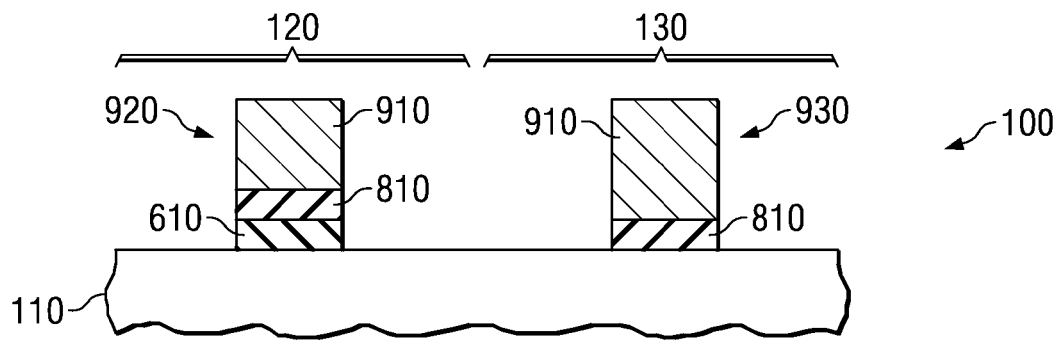

Turning now to FIG. 9, illustrated is the semiconductor device 100 of FIG. 8 after forming a layer of gate electrode material over the left and right active regions 120, 130, and then patterning the layer of gate electrode material, second layer of gate dielectric material 810, and first layer of gate dielectric material 610. What results are a first gate structure 920 and second gate structure 930, located in the left and right active regions 120, 130, respectively. Those skilled in the art understand the processes that may be used to form the layer of gate electrode material, as well as pattern it and the layers of gate dielectric material located therebelow. Thus, no further detail is warranted for this process.

As is illustrated in the embodiment of FIG. 9, the first gate structure 920 includes a gate electrode 910, the second layer of gate dielectric material 810, and the first layer of gate dielectric material 610. The second gate structure 930 includes the gate electrode 910 and the second layer of gate dielectric material 810. In this embodiment, the first gate structure 920 might be tailored for use in an input/output active region, and the second gate structure 930 might be tailored for use in a core region designed for a specific performance and voltage requirement. This configuration, however, is but one embodiment of the present invention.

Turning now to FIGS. 10-17, illustrated are sectional views illustrating how one might, in an alternative embodiment manufacture a semiconductor device in accordance with the principles of the present invention. The process for forming a semiconductor device described with respect to FIGS. 10-17 is very similar to the process for forming a semiconductor device described with respect to FIGS. 1-9. Accordingly, similar reference numerals may be used in certain instances. When used, the similar reference numerals indicate that similar materials and processing conditions could (but not must) be used to form the features. In most instances, the positioning, location or order of formation of the referenced feature may be the only difference between FIGS. 1-9 and the related ones of FIGS. 10-17.

Figure 10:
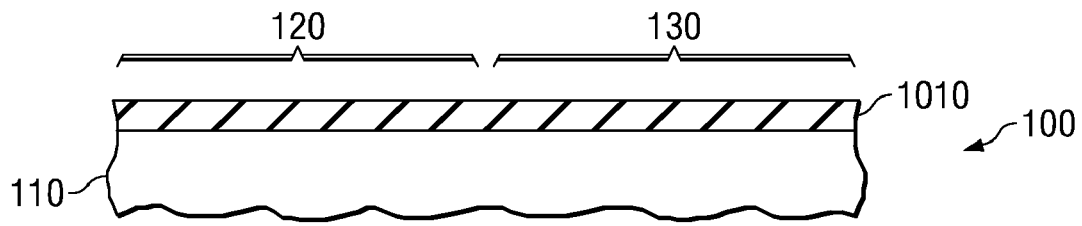
FIGS. 10-17 illustrate sectional views showing how one might, in an alternative embodiment, manufacture a semiconductor device in accordance with the principles of the present invention
Figure 11:
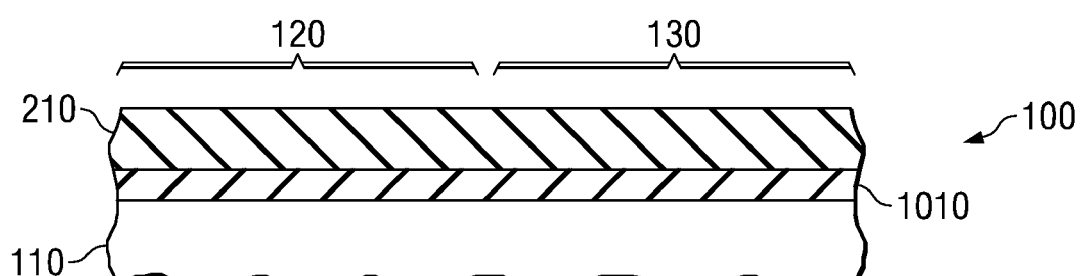
Figure 12:
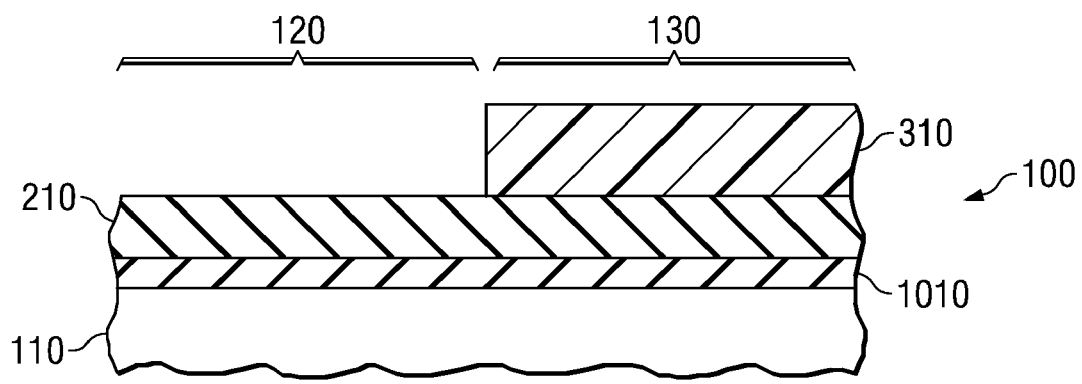
Figure 13:
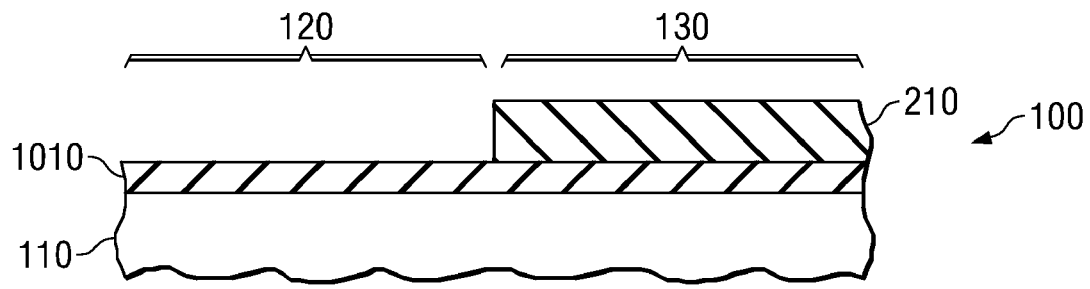
Figure 14:
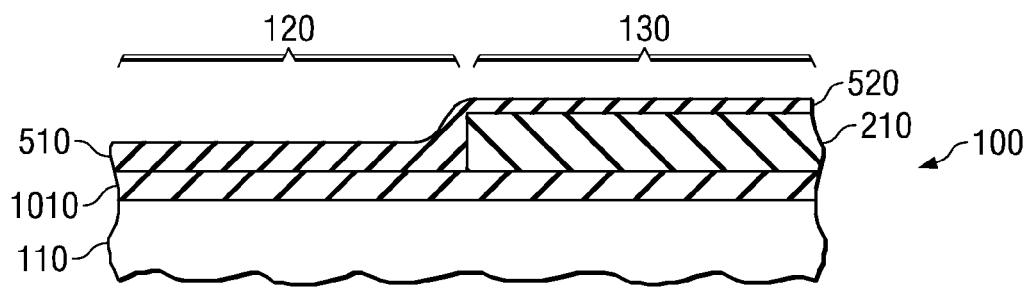
Figure 15:
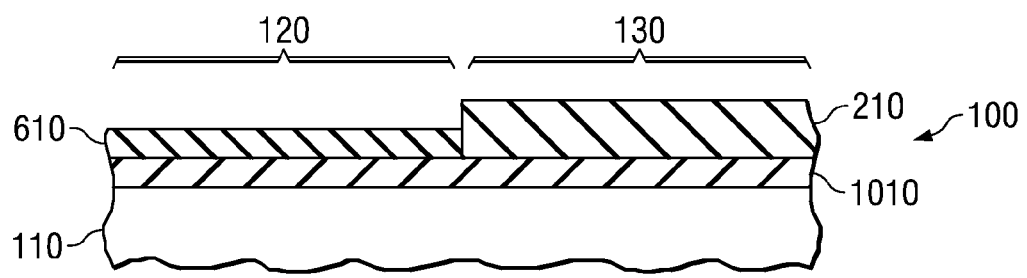

FIG. 10 illustrates the semiconductor device 100 of FIG. 1 after forming a first gate dielectric layer 1010 over the substrate 110 in the left and right active regions 120, 130. The first gate dielectric layer 1010, among others, may be substantially similar in type and formation to the second gate dielectric layer 810 formed in FIG. 8 above. Thus, the skilled person, when reading the description with respect to FIG. 8, would understand its features and any processes that might be required to form the first gate dielectric layer 1010. FIG. 11 is substantially similar to FIG. 2, with the exception that the first gate dielectric layer 1010 is located under the silicon oxide masking layer 210. Thus again, the skilled person when reading the description with respect to FIG. 2 would understand the features and any processes that might be required to manufacture the semiconductor device 100 of FIG. 11. FIGS. 12-15 are substantially similar to FIGS. 3-6, with the exception of the existence of first gate dielectric layer 1010.

Figure 16:
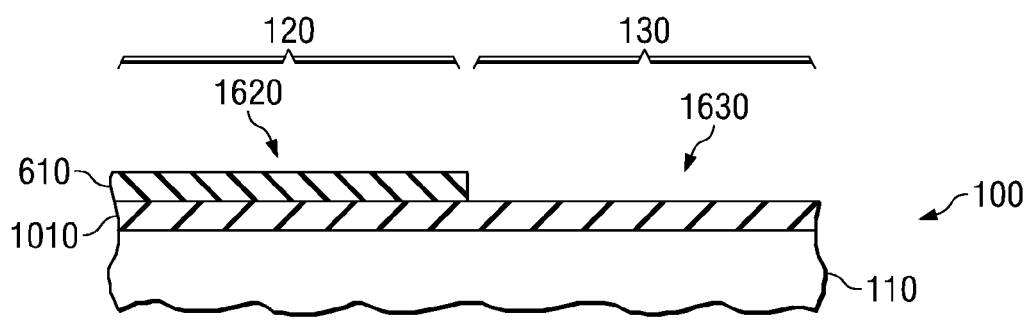
Figure 17:
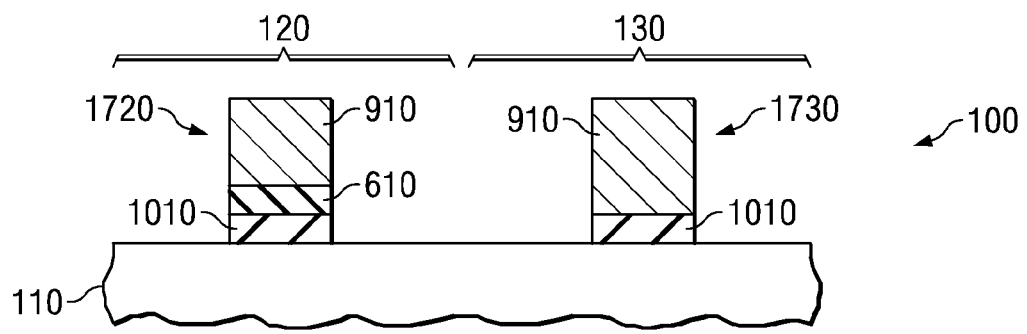

FIG. 16 is substantially similar to FIG. 8, with the exception to the differences shown in previous FIGS. 9-15. Accordingly, what results is a first greater thickness gate dielectric 1620 in the left active region 120 and a second lesser thickness gate dielectric 1630 in the right active region 130. As shown in FIG. 16, the first greater thickness gate dielectric 1620 includes the layer of gate dielectric material 610 and the first layer of gate dielectric material 1010, and the second lesser thickness gate dielectric 1630 includes only the first layer of gate dielectric material 1010. FIG. 17 is substantially similar to FIG. 9, however, in FIG. 17 the first gate structure 1720 includes the gate electrode 910, the first layer of gate dielectric material 1010 and the layer of gate dielectric material 610, and the second gate structure 1730 includes the gate electrode 910 and the first layer of gate dielectric material 1010.

Again, the embodiments of FIGS. 1-9 and 10-17 illustrate how one skilled in the art might manufacture dual gate dielectric thickness layers. For example, in the embodiments of FIGS. 1-9 and 10-17, the left active region 120 might be the first active region and the right active region might be the second active region. If the process of manufacturing the dual gate dielectric thickness layers of FIGS. 1-9 and 10-17 were applied to the formation of triple gate dielectric thickness layers, the left active region 120 might be the first active region, the right active region 140 might be the second active region, and the device might further include a center active region comprising a third active region.

The manufacturing processes taught by FIGS. 1-9 and 10-17 provide many benefits over the standard processes. For instance, these processes use the silicon oxide masking layer, which allows for the easy protection of the substrate, as well as easy removal after using the silicon oxide masking layer. Accordingly, the process is deglaze friendly. Additionally, the process flow is compatible with existing processes, and there is no need for additional patterning steps.

Figure 18:
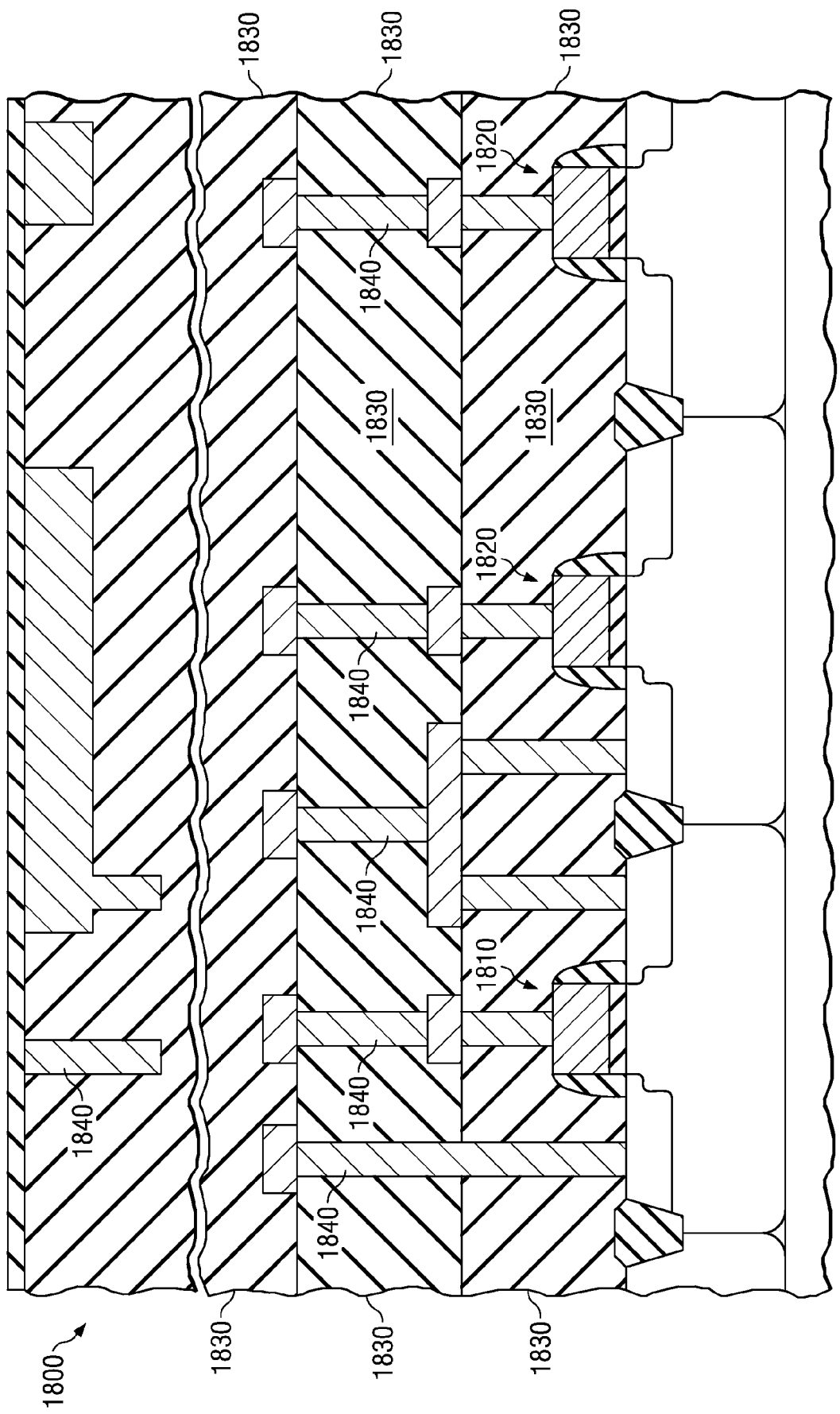
FIG. 18 illustrates a sectional view of an integrated circuit (IC) incorporating semiconductor devices constructed according to the principles of the present invention.

Turning lastly to FIG. 18, illustrated is a sectional view of an integrated circuit (IC) 1800 incorporating semiconductor devices 1810, 1820 constructed according to the principles of the present invention. The IC 1800 may include devices, such as transistors used to form CMOS devices, BiCMOS devices, Bipolar devices, as well as capacitors or other types of devices. The IC 1800 may further include passive devices, such as inductors or resistors, or it may also include optical devices or optoelectronic devices. Those skilled in the art are familiar with these various types of devices and their manufacture. In the particular embodiment illustrated in FIG. 18, the IC 1800 includes an input/output semiconductor device 1810, and one or more core semiconductor devices 1820 manufactured in accordance with the principles discussed above. The semiconductor devices 1810, 1820 have dielectric layers 1830 located thereover. Additionally, interconnect structures 1840 are located within the dielectric layers 1830 to interconnect various devices, thus, forming the operational integrated circuit 1800.

Although the present invention has been described in detail, those skilled in the art should understand that they could make various changes and substitutions herein without departing from the spirit and scope of the invention in its broadest form.

What is claimed is:

1. A method for manufacturing a semiconductor device, comprising:
    forming a silicon oxide masking layer over a silicon substrate in first and second active regions of a semiconductor device;
    patterning the silicon oxide masking layer to expose the substrate in the first active region and remain over the substrate in the second active region;
    subjecting the patterned silicon oxide masking layer and exposed substrate in the first active region to a first radical nitridation;
    following the first radical nitridation, subjecting the patterned silicon oxide masking layer and exposed substrate in the first action region to a first radical oxidation;
    following the first radical oxidation, removing the patterned silicon oxide masking layer, leaving the substrate exposed in the first active region and exposing the substrate in the second active region;
    following removal of the patterned silicon oxide masking layer, subjecting the exposed substrate in the first and second active regions to a second radical nitridation; and
    following the second nitridation, subjecting the exposed substrate in the first and second active regions to a second radical oxidation;
    wherein the first oxidation removes substantially all nitrogen atoms introduced into the patterned silicon oxide masking layer by the first nitridation; and whereby different thicknesses of silicon oxynitride dielectric are formed on the substrate in the first and second active regions.

2. The method of claim 1, further comprising forming a layer of gate electrode material over the different thicknesses of oxynitride dielectric formed in the first and second active regions; and patterning the gate electrode material and oxynitride gate electrode material to form a first gate structure in the first active region and a second gate structure in the second active region; the first gate structure having different thicknesses of oxynitride gate dielectric material.

3. The method of claim 1, wherein the silicon oxide masking layer is grown by oxidation of silicon of the silicon substrate.

4. The method of claim 2, wherein the silicon oxide masking layer is grown to a thickness of 5-10 nm.

5. The method of claim 4, wherein the first radical nitridation provides a layer of nitride atoms on a top surface of the silicon oxide masking layer, with no nitridation at an interface of the silicon oxide masking layer with the remaining silicon substrate.

6. The method of claim 5, wherein removing the patterned silicon oxide masking layer comprises deglazing comprising a wet etch with an aqueous hydrofluoric acid.

7. The method of claim 6, wherein the deglazing uses a 5 or lesser % hydrofluoric acid etch.

8. The method of claim 7, wherein the deglazing uses a 0.5% hydrofluoric acid etch.

9. The method of claim 1, wherein subjecting to a first radical nitridation comprises exposing to a nitrogen containing plasma.

10. The method of claim 9, further comprising subjecting the substrate to a wet chemical clean-up following the patterning and prior to the first radical nitridation.

11. The method of claim 1, wherein the first radical nitridation forms a layer of gate dielectric material of a first thickness over the substrate in the first active region but not in the second active region; and the second radical nitridation forms a layer of gate dielectric material of a second thickness over the first layer of gate dielectric material over the substrate in the first active region, and over the substrate in the second active region.

12. The method of claim 11, wherein the first thickness is 1-3 nm.

13. The method of claim 12, wherein the second thickness is 1-3 nm.

14. The method of claim 13, wherein the silicon oxide masking layer is grown to a thickness of 5-10 nm.

15. The method of claim 1, wherein the first radical nitridation process is conducted at a temperature of 400-800° C., a pressure of 700-900 mTorr, and a microwave power of 500-2000 Watts in the presence of a flow of nitrogen of 50-100 sccm and argon of 950-1000 sccm, for a time period of 10-30 seconds.

16. The method of claim 1, wherein the first radical nitridation process is conducted at a temperature of no greater than 300° C., a pressure of 10-50 mTorr, and an effective RF power of 300-700 Watts in the presence of a flow of nitrogen of 100-500 sccm, for a time period of 10-30 seconds.

17. The method of claim 1, wherein the first oxidation process is conducted at a temperature of 200-400° C., a pressure of 30-150 mTorr, and a microwave power of 500-1500 Watts in the presence of a flow of oxygen of 5-50 sccm and argon of 850-1250 sccm, for a time period of 5-20 seconds.

18. The method of claim 1, wherein the first radical nitridation and first radical oxidation form a first layer of gate dielectric material comprising $Si_xN_yO_z$ of a first thickness over the substrate in the first active region, wherein y>z>0.

19. The method of claim 18, further comprising, wherein the first radical nitridation and first radical oxidation form a first layer of gate dielectric material; and further comprising, following the first radical oxidation, subjecting the first layer of gate dielectric material to a reoxidation.

20. The method of claim 19, wherein the reoxidation uses an anneal temperature of 900-1100° C., a pressure of 10-50 mTorr, and an $O_2$, $N_2$, NO or any mixture thereof flow rate of 10-20 slm, for a time period of 2-20 seconds.

* * * * *